United States Patent
Takara

(10) Patent No.: US 11,409,939 B2
(45) Date of Patent: Aug. 9, 2022

(54) TEST GENERATION SYSTEMS AND METHODS

(71) Applicant: VAXEL Inc., San Jose, CA (US)

(72) Inventor: Jun Takara, Seika-cho (JP)

(73) Assignee: VAXEL Inc., San Jose, CA (US)

( * ) Notice: Subject to any disclaimer, the term of this patent is extended or adjusted under 35 U.S.C. 154(b) by 0 days.

(21) Appl. No.: 16/841,346

(22) Filed: Apr. 6, 2020

(65) Prior Publication Data

US 2020/0320245 A1  Oct. 8, 2020

Related U.S. Application Data

(60) Provisional application No. 62/830,093, filed on Apr. 5, 2019.

(51) Int. Cl.
*G06F 30/30* (2020.01)
*G06F 30/398* (2020.01)

(52) U.S. Cl.
CPC ................. *G06F 30/398* (2020.01)

(58) Field of Classification Search
CPC .... G06F 30/398; G06F 30/3308; G01R 31/36
USPC ........................................................ 716/136
See application file for complete search history.

(56) References Cited

U.S. PATENT DOCUMENTS

| | | | |
|---|---|---|---|
| 6,526,562 B1* | 2/2003 | Haddad | G06F 30/33 716/104 |
| 6,530,054 B2 | 3/2003 | Hollander | |
| 6,687,662 B1 | 2/2004 | McNamara et al. | |
| 6,782,518 B2* | 8/2004 | Decker | G06F 11/3676 703/13 |
| 7,502,728 B1* | 3/2009 | Hurlock | G01R 31/31707 703/23 |
| 7,805,690 B2* | 9/2010 | Willis | G06F 30/327 716/103 |
| 2004/0073890 A1 | 4/2004 | Johnson | |
| 2012/0260132 A1 | 10/2012 | Blue | |
| 2013/0086538 A1 | 4/2013 | Fister | |

* cited by examiner

*Primary Examiner* — Jack Chiang
*Assistant Examiner* — Brandon Bowers
(74) *Attorney, Agent, or Firm* — David R. Stevens; Stevens Law Group

(57) ABSTRACT

Example test generation systems and methods are described. In one implementation, a hardware test suite generator includes a script reader that receives a test definition script and parses the test definition script. A test generator receives the parsed test definition script from the script reader and creates a test suite. A template reader receives a test definition template and parses the test definition template. A code generator receives the parsed test definition script from the script reader and receives the parsed test definition template from the template reader.

19 Claims, 12 Drawing Sheets

```
# Parameters
Kind         = {MDDR, DDR}
Size         = {1G, 2G, 4G}
Num          = {1, 2}
BaseClock    = {333, 400}
Vendor       = {S, M}

# Invalid combinations
!illegalNum        = Kind [MDDR] & Num [2]
!illegalMDDRSize   = Kind [MDDR] & Size [4G]
!illegalDDRSize    = Kind [DDR] & Size [1G]

Expected combinations (The aboves are excluded)

# DramCfg: 2x3x2 = 12, excluded by illegal* => 6
DramCfg = Kind * Size * Num
```

```
iTGV Script:                System Verilog:
par_a = {a0, a1}            typedef enum int { a0=0, a1 } par_a_type;
par_b = {b0, b1}            typedef enum int { b0=0, b1 } par_b_type;
cmb = par_a * par_b
                            par_a_cp: coverpoint par_a {
                              bins a0 = { par_a_type::a0 };
                              bins a1 = { par_a_type::a1 };
                            }
                            par_b_cp: coverpoint par_b {
                              bins b0 = { par_b_type::b0 };
                              bins b1 = { par_b_type::b1 };
                            }
                            cmb_xc: cross par_a_cp, par_b_cp;
```

FIG. 8

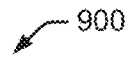

```
# Parameters
Kind     = {MDDR, DDR}
Size     = {1G, 2G, 4G}
Num      = {1, 2}
BaseClock = {333, 400}
Vendor   = {S, M}

# Invalid combinations
IllegalNum      = Kind[MDDR] & Num[2]
IllegalMDDRSize = Kind[MDDR] & Size[4G]
IllegalDDRSize  = Kind[DDR] & Size[1G]
# Robust, included in IllegalMDDRSize
IllegalClock    = Kind[MDDR] & Size[4G] & BaseClock[400] # <=

# Expected combinations (The aboves are excluded)
# Define 2 types of combination for "Kind", no need to mind with each other
DramCfg = Kind * Size * Num
ClkMode = Kind * BaseClock # <=
```

| Statements | |
|---|---|
| Bind Statement: | ex) par_a = {a0, a1} |
| | ex) comb = par_a * par_b |
| Import Statement: | ex) import file_a.itg as grp_a |
| | ex) from file_a.itg import * |

| Operators for expression | |
|---|---|
| Unary operator: | "~" |
| Binary operators: | "*", "&", "\|", "-", "+" |
| Parenthesized Form: | "(", ")" |
| Subscription: | ex) par_a[a0] |

| Explicit Composite Axis | |
|---|---|
| | ex) CompAxis = {ax: Axis1[a] & Axis2[x], ay: Axis1[a] & Axis2[y]} |

| Objects | |
|---|---|
| Set: | ex) par_a[a0] |
| Axis: | ex) par_a |

| Categories of Objects | |
|---|---|
| Expected Set/Axis: | ex) par_a, comb |
| Illegal Set: | ex) !illegal_c0 |
| Temporary Set/Axis: | ex) _temp_c |

FIG. 11

TEST GENERATION SYSTEMS AND METHODS

CROSS REFERENCE TO RELATED APPLICATIONS

This application claims the benefit of U.S. Provisional Application Ser. No. 62/830,093, entitled "Test Generation For Hardware Verification Systems And Methods," filed Apr. 5, 2019, the disclosure of which is incorporated herein by reference in its entirety.

TECHNICAL FIELD

The present disclosure relates to test generation systems and methods for hardware design verification.

BACKGROUND

Existing hardware design verification systems and methods have certain limitations in terms of convenience and functionality. For example, an existing hardware design verification methodology is the Universal Verification Methodology. The Universal Verification Methodology is useful for verifying integrated circuit designs and other types of hardware. In some situations, the Constrained Random approach is used for hardware device test suite generation. The Constrained Random approach typically uses randomization as the basis for the hardware verification.

However, the Constrained Random approach is a wasteful methodology by nature and, as the coverage nears the target, its "hit rate" worsens significantly. Thus, many verification engineers complement the Constrained Random approach with the Directed approach. However, the Directed approach also has its own limitations. Although the Directed approach can be precise in hitting the target parameter combinations, it may require a significant amount of thinking and manual processing to generate relevant tests.

Today, there are two common approaches in hardware design related to Register Transfer Level (RTL) verification. These approaches are the Directed approach and the Constrained Random approach. For example, the Directed approach is often considered a focused approach (similar to a sniper's rifle) whereas the Constrained Random approach is less focused (similar to a shotgun). The Directed approach includes significant manual processing. Modern hardware designs are so complex that manually generating all test suites (also referred to as test patterns or test vectors) is very difficult or impossible. Thus, in many cases, the Constrained Random approach is the common choice of verification engineers.

Many testing systems use coverage-driven verification (CDV). Verification engineers may use both Directed and Constrained Random approaches to generate test suites. For example, the Directed approach may be chosen to start off with feature-specific verification processes because of its simplicity and ease of use. Typically, shortly after, engineers elect to switch to the Constrained Random approach because it generates test suites to cover many features efficiently.

Although the Directed approach is generally easy to set up and precise in covering the target, it has three issues. First, the Directed approach can quickly become very labor intensive. On the one hand, it is precise in providing coverage for a specific feature with a specific parameter combination. But, on the other hand, when multiple features call for multiple combinations of parameters, many test suites must be generated one-by-one to provide coverage to all of them.

Second, the Directed approach is often difficult to manage because it relies on verification engineers to manually document the test suites (in a low-level form, such as on an Excel file). Frequently, this file is treated as equivalent to a Functional Coverage report, which is to be used for reviews of the verification process. Since the document is recorded in a low-level form, reading it can be a nontrivial, time-consuming task. This is a problem when trying to identify what combinations are missing or purposefully omitted. This problem expands when the feature count increases, and often ends up in a complex situation when test angles or aspects change.

Third, the Directed approach is often susceptible to changes and updates. In many verification projects, there are situations where test suites and their associated documents must be revised. Reviews can reveal missing test suites. Changes in specifications can cause modifications in verification plans. All these situations can cause a significant amount of investigation on what test suites need to be added or modified. Usually, this investigation must consider not just the features that are directly affected by the change but also all the other features.

The Constrained Random approach allows a user to generate many test suites easily to cover a large group of targets when compared with the Directed approach. However, verification engineers typically must prepare flexible self-check mechanisms because determining what to be tested is unpredictable.

When using the Constrained Random approach, verification engineers generally have two goals. One, that the process will eventually produce a set of necessary test suites among many randomly generated test suites. Two, that the process also generates some additional test suites that can provide more test coverage, which could have been overlooked if the process were configured manually. However, the Constrained Random approach has two problems that can cause slowdowns and frustrations in the verification processes.

The first problem of the Constrained Random approach is its wastefulness. It is unavoidable that the test suites generated by the Constrained Random process include a large number of duplicates. As the name suggests, a set of constraints can be defined as an attempt to apply a certain level of control over the associated randomness. However, because putting too many constraints will defeat the purpose of generating useful test suites, constraints are typically set rather loosely. This means the verification process will likely end up executing many redundant test suites. Thus, the more parameters and combinations that exist in the design, the more wasteful and useless test suites are generated. As a result, the total time required for verification may increase significantly. Additionally, this problem gets amplified as the test coverage nears the target mark (100%), because most of the test suites generated would then be duplicates rather than ones that are needed to capture the uncovered combinations of parameters. This makes the verification process very inefficient.

A second problem of the Constrained Random approach is that the process is largely out of control from a verification engineer's viewpoint, including the lack of visibility. In most situations, verification engineers can only control seeds and constraints. Then they have no idea about what test suites will be generated. The report by Functional Coverage can help them determine what targets are covered only as a result. Consequently, it is also difficult to provision how many more test suites would be needed to reach the target coverage.

Related to this issue, one frustrating situation would be to try to hit a very specific coverage space with the Constrained Random approach. Verification engineers may spend hours adjusting the constraints to aim at the coverage hole. However, this leads to generation of more duplicate test suites. Again, it does not provide intelligence as to how many test suites are needed to hit the coverage hole. Out of frustration, engineers may choose to switch back to the Directed approach to hit the coverage precisely. Then, this effort with the Directed approach to reach the coverage goal often becomes wasteful when constraints get updated.

Due to the limitations described above, verification engineers often decide to use both the Directed and Constrained Random approaches. A common way to use the two approaches is to start with the Directed approach to test the fundamental features, and then proceed to use the Constrained Random approach to broaden the test targets to include both fundamental and non-fundamental features. In this manner, all expected combinations can be covered. However, the fundamental features are covered by both the Directed approach and Constrained Random approach. Thus, there is a tendency for redundancy.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

FIG. 5 illustrates an example iTGV script.

FIG. 8 illustrates an example comparison between the iTGV script and System Verilog.

FIG. 9 illustrates an example of an iTGV script showing a permissive and flexible approach that allows intuitive scripting by verification engineers.

FIG. 10 illustrates an example of an iTGV template.

FIG. 11 illustrates an example list of iTGV syntax statements.

DETAILED DESCRIPTION

Figure 1A:
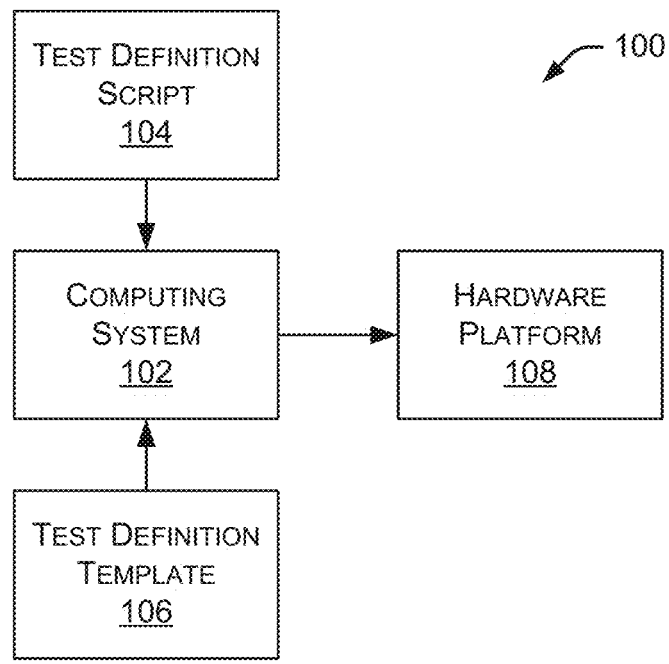
FIG. 1A is a block diagram illustrating an embodiment of a test generation system with output to a hardware platform.

In the following disclosure, reference is made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter is described in language specific to structural features and/or methodological acts, it is to be understood that the subject matter defined in the appended claims is not necessarily limited to the described features or acts described herein. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

At least some embodiments of the disclosure are directed to computer program products comprising such logic (e.g., in the form of software) stored on any computer useable medium. Such software, when executed in one or more data processing devices, causes a device to operate as described herein.

The systems and methods discussed herein describe a new test generation system, referred to herein as an Intelligent Test Generator for Verification (iTGV). The iTGV provides an improved system and approach to hardware design verification as compared to the existing systems (e.g., Constrained Random and Directed approaches) discussed herein. The iTGV allows verification engineers to more efficiently perform hardware design verification. In some implementations, the Directed approach is replaced with iTGV. In particular embodiments, the iTGV is used in combination with the Constrained Random approach to provide additional coverage in unexpected and unintended areas. In some situations, verification engineers may use iTGV to insert one or more specific test sequences to reach a deep state as part of the hardware design verification.

FIG. 1A is a block diagram illustrating an embodiment of an iTGV 100 with output to a hardware platform. As discussed herein, a hardware platform includes a field-programmable gate array (FPGA), a digital signal processor (DSP), a microcontroller, or any other type of hardware platform. In some embodiments, iTGV 100 runs on a computing system 102 that is configured to receive a test definition script 104 and a test definition template 106. In particular implementations, the test definition script is written in a scripting language. For example, a scripting language may define a script referred to as an "iTGV script," which is used to write test definition script 104. In some embodiments, the iTGV script is prepared by one or more verification engineers that describe all possible parameter-to-value combinations along with prohibitions in the script.

In particular embodiments, test definition template 106 includes additional inputs that are used by the test generation system.

In some embodiments, iTGV 100 generates a test code that is downloadable on a hardware platform 108, such as a FPGA, a DSP, a microcontroller, or some other hardware platform. For example, an output of iTGV 100 may be a text file that may include register transfer levels (RTLs). These RTLs are then compiled and downloaded to, for example, an FPGA with RTLs of a device under test (DUT). The test code associated with the RTL is then run on the FPGA, and the results are verified.

Figure 1B:
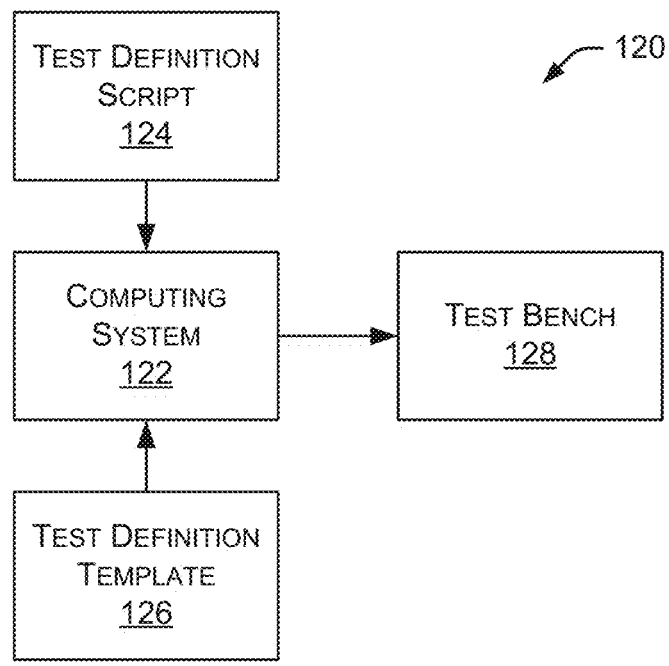
FIG. 1B is a block diagram illustrating an embodiment of a test generation system with output to a test bench.

FIG. 1B is a block diagram illustrating an iTGV 120 with output to a test bench. As shown in FIG. 1B, iTGV 120 includes a computing system 122, a test definition script 124, and a test definition template 126, which are similar to the corresponding system, script, and template shown in FIG. 1A. In the embodiment of FIG. 1B, the test code is used in a test bench 128 or a test vector for simulation or emulation. In general, the output of the test generation system is a source code to a device under test or a test bench. In some embodiments, the test code is generated in a programming language such as System Verilog and C.

In particular implementations, an iTGV script includes the following information:

1. Parameter definitions, where the parameters are controlled in the test (i.e., defining an n-d finite space).
2. One or more combinations of parameters to be tested (Define Expected).
3. Combinations of parameters that are prohibited (Define Illegals).

In some embodiments, an iTGV Template is a source code of the target verification environment. The iTGV template is parameterized source code by variables which are defined in the corresponding iTGV script. A code generation phase fills the variables with actual values determined by test generation.

As discussed herein, a test definition script defines various parameters, values, legal (expected), and illegal combinations. A test definition template defines the format for the target test environment. When the test definition script is input to iTGV, a test suite is generated. When the test definition template together with the test suite are both input to iTGV, a test code is generated. The test suite is an output that contains a minimum number of tests that 100% accommodate conditions on the test definition script. The test code is an output that accommodates the format provided by the test definition template.

Figure 2:
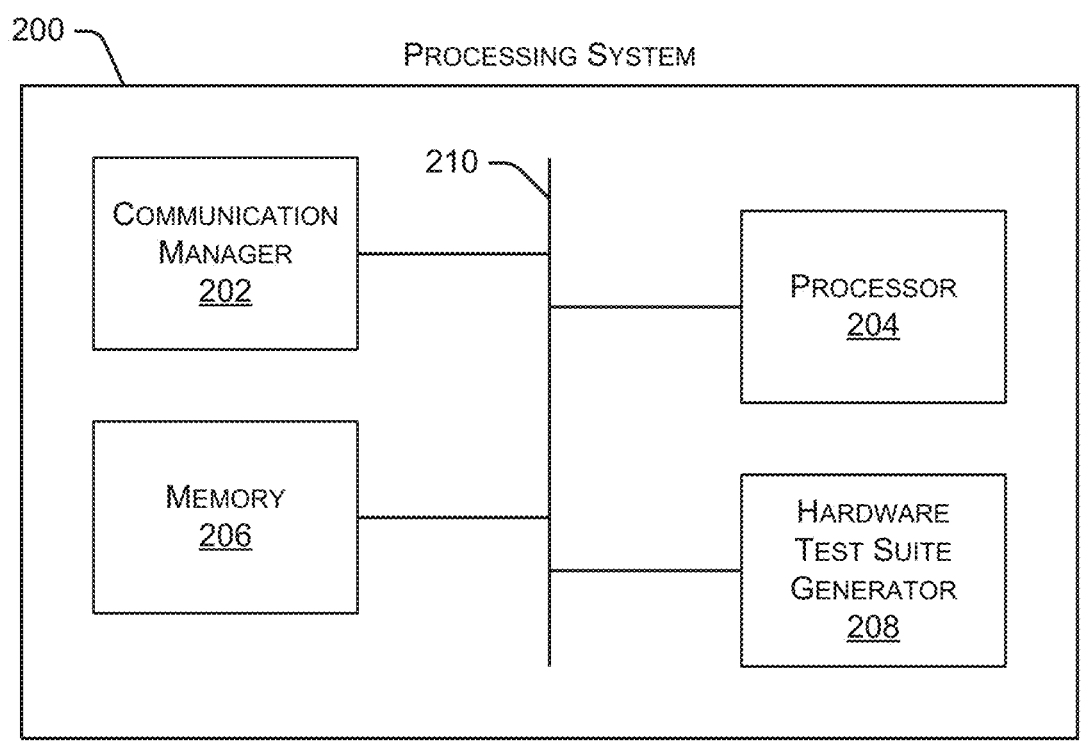
FIG. 2 is a block diagram illustrating an embodiment of a processing system used to implement the test generation system.

FIG. 2 is a block diagram illustrating an embodiment of a processing system 200 used to implement the test generation system discussed herein. As shown in FIG. 2, processing system 200 includes a communication manager 202, a processor 204, and a memory 206. Communication manager 202 allows data processing system 200 to communicate with other systems, such as data communication systems, data processing systems, test systems, and the like. Communication manager 202 may also manage communication and implement communication protocols between different components of processing system 200 and other systems. Communication between these different components is achieved via a data bus 210.

Processor 204 executes various instructions to implement the functionality provided by processing system 200, as discussed herein. For example, processor 204 may perform processing functions associated with the test generation system, such as arithmetic calculations and other input/output operations. Memory 206 stores instructions as well as other data used by processor 204 and other modules and components contained in processing system 200. In some embodiments, memory 206 stores data associated with the operation of processing system 200, including temporary data and permanent data. The data stored by memory 206 may also include test definition scripts, test definition templates, and other outputs of the test generation system. The memory may be implemented using any combination of memory elements such as RAM, ROM, flash drives, hard drives, and the like.

Processing system 200 also includes a hardware test suite generator 208 that performs various functions, such as those described herein. For example, hardware test suite generator 208 processes test definition scripts and test definition templates, and produces one or more test cases, as described herein.

Figure 3:
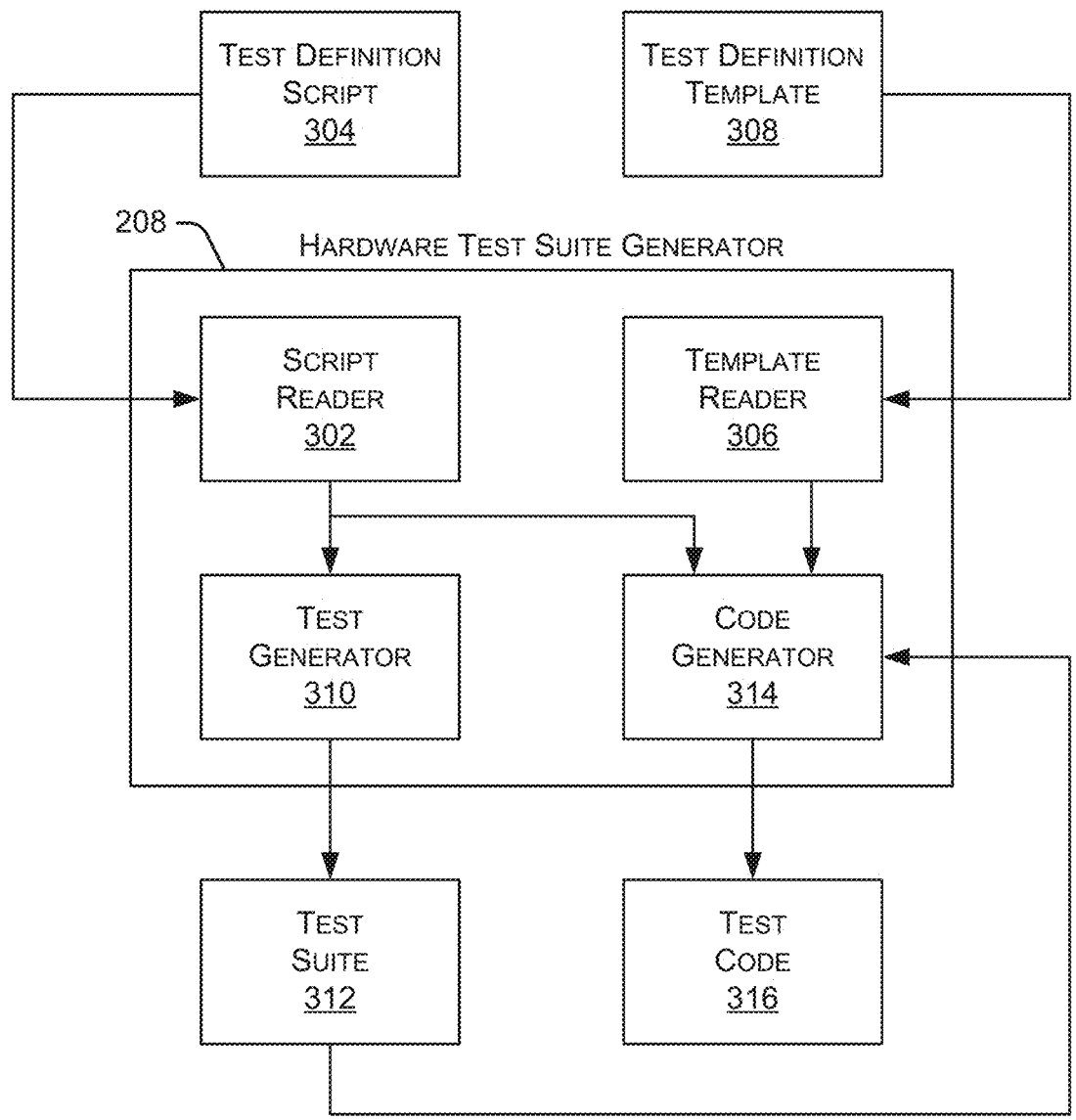
FIG. 3 is a block diagram illustrating an embodiment of a hardware test suite generator.

FIG. 3 is a block diagram illustrating an embodiment of a hardware test suite generator 208. In some embodiments, hardware test suite generator 208 includes a script reader 302 and a template reader 306 that are configured to individually read in a test definition script 304 and a test definition template 308, respectively. Script reader 302 and template reader 306 parse and decode test definition script 304 and test definition template 308, respectively. The output of script reader 302 is input to a test generator 310 and a code generator 314. Test generator 310 outputs a test suite 312. The output of template reader 306 is input to code generator 314, which also reads in test suite 312. Code generator 314 processes the output from script reader 302, the output from template reader 306, and test suite 312, to generate a test code 316. Together, test suite 312 and test code 316 can be downloaded to a hardware platform for testing. In some embodiments, test code 316 can be directly used in environments such as System Verilog and C. Hardware test suite generator 208 can be configured to operate on various computing systems, such as a Windows computing system, an Apple Macintosh computing system, a Linux computing system, and the like.

In some embodiments, the definitions of the iTGV test definition scripts can be categorized as discussed below. The iTGV test definition script is an instruction for iTGV regarding how to generate a test suite. The iTGV test definition script also defines the coverage related to which combinations should be covered.

1. Base Axis (Parameter)

Parameter definitions.

The parameter and its values are defined.

Each test selects a value of all parameters.

Define the space of the problem.

The number of the Base Axis is the dimension of the space.

For example, see example parameters shown in FIG. 5 and included below.

Kind={MDDR, DDR} (Kind of connecting DRAM, having 2 values(variations).)

Size={1 G, 2 G, 4 G} (Size of connecting DRAM (bit).)

Num={1, 2} (Number of chips to be connected.)

BaseClock={333, 400} (Base clock of DRAM (MHz))

Vendor={S, M} (Vendor of DRAM model.)

2. Illegal set (Prohibited combinations)

Defined by set operations of Base Axes and the other defined sets. The name is starting from '!'.

For example, see example invalid combinations shown in FIG. 5 and included below.

Never make any tests for MDDR with number=2

!illegalNum=Kind[MDDR] & Num[2]

Never make any tests for MDDR with size=4 Gb

!illegalMDDRSize=Kind[MDDR] & Size[4 G]

Never make any tests for DDR with size=1 Gb

!illegalDDRSize=Kind[DDR] & Size[1 G]

3. Expected combinations (Composite Axis)

Define the expected combination desired to be covered.

Defined by set operations of Base Axes and the other defined sets.

All expected sets would be covered in at least one test.

Base Axes are also expected sets, all values of all Base Axes would be covered.

For example, see example expected combinations shown in FIG. 5 and included below.

DramCfg=Kind*Size*Num

Make test to take all combinations of the 3 parameters.

These are the 12 combinations (sets) defined by the above and shown in Table 1.

TABLE 1

| Kind | Size | Num | Excluded By |
|------|------|-----|-------------|
| MDDR | 1 G | 1 | |
| MDDR | 1 G | 2 | !illegalNum |
| MDDR | 2 G | 1 | |
| MDDR | 2 G | 2 | !illegalNum |
| MDDR | 4 G | 1 | !illegalMDDRSize |
| MDDR | 4 G | 2 | !illegalNum, !illegalMDDRSize |
| DDR | 1 G | 1 | !illegalDDRSize |
| DDR | 1 G | 2 | !illegalDDRSize |
| DDR | 2 G | 1 | |
| DDR | 2 G | 2 | |
| DDR | 4 G | 1 | |
| DDR | 4 G | 2 | |

Note that six of the above 12 sets in Table 1 are excluded because of illegal sets definitions in FIG. 5. Thus, iTGV does not make tests for the six uncoverable tests, as identified above.

The following description provides a summary of the process to generate a test suite from an iTGV test definition script. All processes goes with n-D set operations.

1. Exclude uncoverable sets in all expected sets

Reduce the candidate of the expected sets

For example, the six sets discussed above are excluded.

2. Make a current test from the whole set by narrowing down the "set".

2.1. Select an expected set from the current candidate sets. (Default candidate sets are the result of step 1 (above).)

The current test is updated with taking an intersection with the set.

To minimize the total number of tests to be generated, choose the set which has the most intersection with other expected sets.

2.2. Mark "covered" if the updated test is a subset of the expected set.

2.3. Filter the current candidate sets by having intersection with the current test.

2.4. If there are no candidate sets after the filtering:

If the size of test in n-D space is more than one, select a point at random from the current test set.

Complete to make a test and exit 2.

2.5 If there is one or more candidate sets, repeat from 2.1.

3. Repeat making tests until all expected sets are marked as "covered". In some embodiments, the process is based on the PICT algorithm. Table 2 below is an example test suite generated from the above script.

TABLE 2

| Kind | Size | Num | BaseClock | Vendor |
|------|------|-----|-----------|--------|
| DDR  | 4 G  | 1   | 333       | M      |
| DDR  | 4 G  | 2   | 400       | M      |
| DDR  | 2 G  | 1   | 400       | S      |
| MDDR | 1 G  | 1   | 333       | S      |
| MDDR | 2 G  | 1   | 333       | M      |
| DDR  | 2 G  | 2   | 333       | M      |

The first row in Table 2 is the header line, which shows the parameter (Base Axis) of each column. The remaining rows are each a generated test. From the test suite, the code generator generates the test code. In some embodiments, variables in the template (e.g., the iTGV template shown in FIG. 10) are replaced with the value based on the test suite for each test. For example, "{{test.Kind}}" in the template is replaced with "DDR" in the first test.

Figure 4:
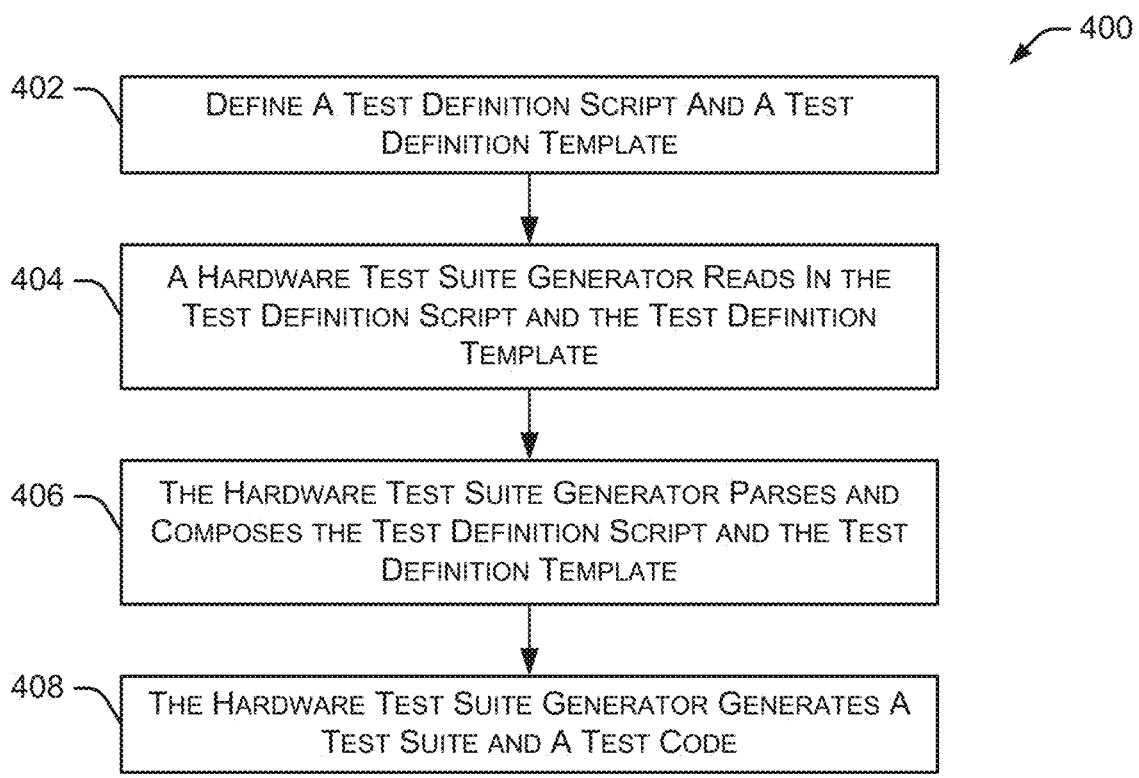
FIG. 4 is a flow diagram illustrating an embodiment of a method for generating a test suite and a test code.

FIG. 4 is a flow diagram illustrating an embodiment of a method 400 for generating a test suite and a test code. Initially, a user (e.g., a verification engineer) defines 402 a test definition script and a test definition template. In some embodiments, these definitions include defining a space that further includes an n-dimensional finite set, as well as expected and illegal states, by using set operations. As discussed herein, the iTGV test definition script defines expected and illegal sets in n-D space. A user may define Base Axes based on what they want to test or control. Essentially, all inputs are defined as Base Axes directly or indirectly. Illegal sets are based on the specification of the device under test. Expected sets are defined according to the combinations they want to test. The expected sets tend to be changed by the specification and the priority to test. For example, during a long verification period, the verification strategy may change for various reasons, such as the priority of the expected sets being changed to improve the quality of the verification by review. In some embodiments, the system assumes that the expected sets are updated during the verification process.

Method 400 continues as a hardware test suite generator reads in 404 the test definition script and the test definition template. As the method continues, the hardware test suite generator parses and composes 406 the test definition script and the test definition template. In some embodiments, the parsing and composing processes are performed on n-dimensional set objects.

Finally the hardware test suite generator generates 408 a test suite and a test code. In some embodiments, the generation of the test suite is done by a modified PICT (Pairwise Independent Combinatorial Testing) algorithm that is extended to work on n-dimensional set operations. In particular embodiments, the test suite is generated based on n-dimensional set operations, and each test is a member of an n-dimensional set.

The systems and methods described herein provide advantages when performing test Generation for hardware verification. For example, in some implementations, the iTGV provides up to 100% test coverage with an approximate minimum number of test suites without generating any duplicate or wasteful excess. The iTGV may provide ease of tracing and tracking what tests are performed for what purposes simply by reading the iTGV Script. The systems and methods know how many tests are required by generating a test suite by iTGV without running any tests in simulation or emulation. Thus, the time for iTGV test generation is small compared to the time required to run the actual tests. But in the Constrained random approach, the systems and methods need to run tests and check the functional coverage after running every test to know whether the test covers 100% or not. In some implementations, the iTGV provides simultaneous generation of a test code for System Verilog, C, and other test environments using iTGV templates. Additionally, an iTGV script may be straightforward and relatively easy to learn and write.

Other benefits of the iTGV include, for example:
1. The process is mostly automated.
2. The process is precise when generating test suites to rapidly provide 100% coverage with a substantially minimum number of test suites.
3. The process gives a transparent traceability and visibility throughout the entire verification process.
4. The process has a feature to accommodate and manage the incremental verification process to generate only the test suites that would reflect additionally defined parameter combinations.
5. The process provides test codes that are directly usable in other verification environments, such as System Verilog, C, and so on.

In some embodiments, the iTGV is able to reach 100% coverage rapidly, with a substantially minimum number of test suites. This process guarantees that 100% coverage is reached with a substantially minimum number of test suites.

In some embodiments, the described systems and methods assume that one or more iterations are required when the specification or verification strategy is changed. In that situation, the user will update the iTGV Script and regenerate the test suite. In this scenario, there are two choices to generate:
1. Keep the last test suite and add tests only for the difference (e.g., incremental mode).
2. Create a test suite from scratch.

Figure 7:
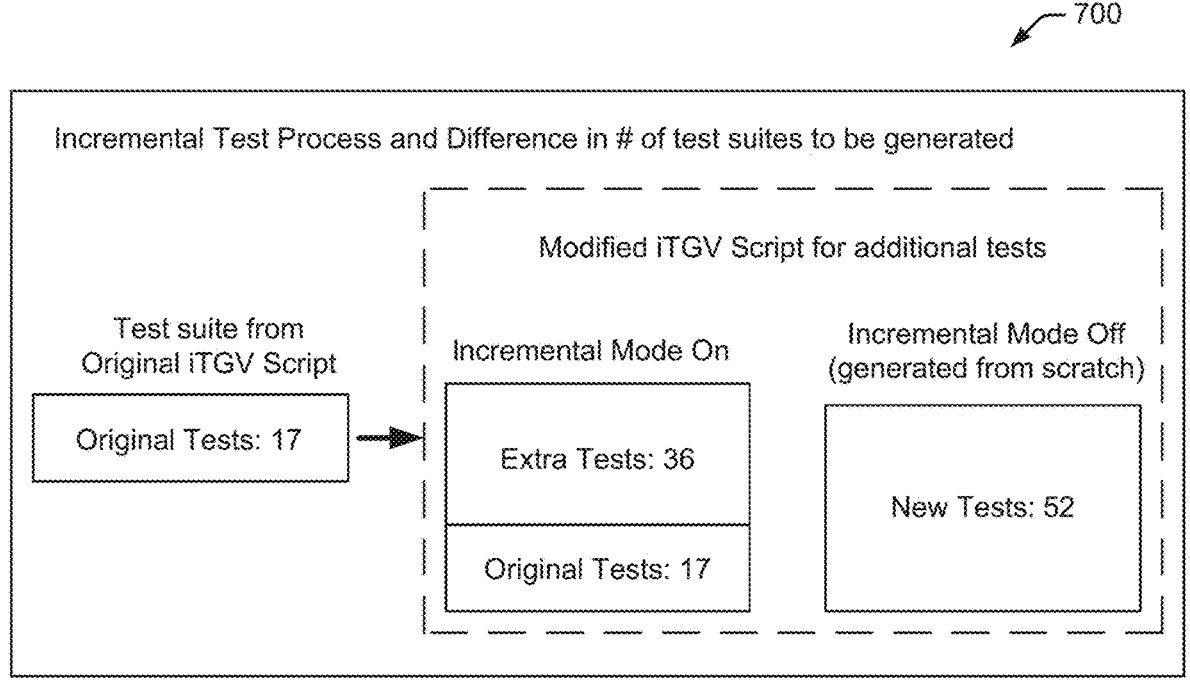
FIG. 7 illustrates an image of an example incremental testing process.

These two approaches are described in FIG. 7, herein.

FIG. 5 illustrates an example iTGV script 500. The iTGV receives an iTGV script 500 and provides it to its test generation engine based on an extended PICT algorithm, and automatically generates a full set of test suites to meet all the conditions defined with the iTGV script. This full set of test-suites is calculated to be substantially minimum in count.

As shown in FIG. 5, the example iTGV script 500 includes various parameters (e.g., Kind, Size, Num, BaseClock, and Vendor). The example iTGV script 500 also identifies multiple invalid combinations, such as illegal Num, illegal MDR size, and illegal DDR size. As shown in FIG. 5, DramCfg is the definition to specify the expected combinations. In some embodiments, iTGV make tests to cover all combinations defined in this except the sets matching with all illegal sets.

Figure 6:
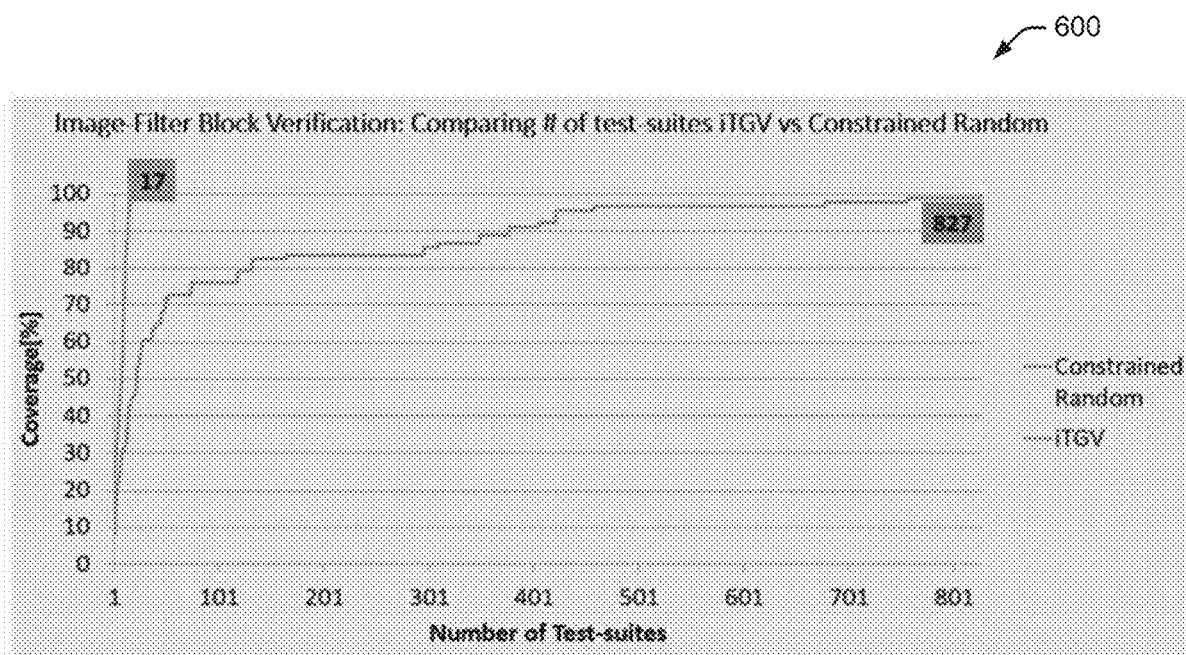
FIG. 6 illustrates an example graph comparing the iTGV and the Constrained Random approaches.

FIG. 6 illustrates an example graph 600 comparing the iTGV and the Constrained Random approaches. Graph 600 represents a specific real-world example in which a target design provided a clear set of input parameter combinations. This target design was associated with an image-processing sub-block design where functions were driven by many registers and many modes. In scenario of FIG. 6, the iTGV reached the target coverage with only 17 test suites, whereas the Constrained Random approach produced 827 test suites. Graph 600 illustrates a comparative plot of the real-world example.

In some embodiments, the iTGV may generate random-like test suites without being instructed to do so. In some embodiments, random-like (e.g., unintentional combination) test suites are generated by iTGV because of the PICT algorithm. Additionally, in some situations, iTGV is implemented to split spaces based on the parameter relation at the beginning. After generating a test suite for each subspace, the test suites of each subspace are randomly merged to be a test suite. For example, the iTGV script shown in FIG. 5 is split into the following three subspaces:

1. Kind, Size, Num
2. Vendor
3. BaseClock

In other implementations, the iTGV allows verification engineers to modify and re-process the iTGV Script when they discover some additional parameter-to-value combinations after executing the original test. In this situation, the iTGV calculates and produces only the minimum number of test suites to satisfy the change.

FIG. 7 illustrates an image of an example incremental testing process 700. In this example, verification engineers can continuously modify and process the iTGV Script to achieve 100% coverage and keep the additional number of test suites to a substantial minimum. As shown in FIG. 7, the process starts off with 17 original tests. The modified iTGV script shown in FIG. 7 generates additional tests. The iTGV script has two modes. In an incremental mode, the iTGV script generates the 17 original tests, and 36 extra tests. When incremental mode is turned off, 52 new tests are generated from scratch. In some embodiments, the mode is switched by inputting a test suite or not. For incremental mode, the last test suite is input with the updated iTGV script. From scratch, only the updated iTGV script is input.

In some embodiments, reading an iTGV script will easily provide visibility and traceability for verification projects. Unlike the Constrained Random approach, where test after test is generated until the target coverage is reached at some unknown time, the iTGV gives the full set of test suites immediately to meet the coverage goal that was defined with iTGV script. The number of tests that would need to be run is known immediately, so the planning is much easier. In some embodiments, the systems and methods can know how many tests are required by generating a test suite by the iTGV, as discussed herein. In addition, the iTGV script is generally easy to write and is easy and straightforward to read. The iTGV script can provide instantaneous views in terms of traceability and visibility regarding the test in progress.

Another advantage of the iTGV script is that it is relatively easy to learn, understand and write. The iTGV script resembles Functional Coverage with System Verilog and is typically much simpler. The iTGV script is designed so that verification engineers do not need to acquire any new skills. In some situations, it usually takes about several hours to half a day to learn the iTGV script language sufficiently. Its syntax is significantly simpler, more flexible, and more powerful than other systems. In many situations, the iTGV script can easily describe complex situations.

FIG. 8 illustrates an example comparison 800 between the iTGV script and System Verilog. In FIG. 8, the iTGV script is shown on the left side of comparison 800 and an equivalent System Verilog code is shown on the right side of comparison 800. As shown in FIG. 8, the iTGV script is much more compact, efficient, and easy to understand as compared to its System Verilog equivalent.

In some embodiments, a notable characteristic of the iTGV Script is that it has very few restrictions. The iTGV Script allows verification engineers to script combinations more intuitively. The functional coverage of System Verilog is close in that it defines the coverage of the combination of parameters and prohibited combination. The iTGV script is more powerful and more concise to describe the combination. For example, the System Verilog functional coverage cannot define "cross of cross", but iTGV can define it. In some implementations, the iTGV Script permits the verification engineer to reference the parameters in a duplicated way. It is also possible to independently define combinations of fragmental parameters for different functions. Both the combinations expected, and the combinations prohibited, can be defined independently as they occur to the verification engineers.

FIG. 9 illustrates an example of an iTGV script 900 showing a permissive and flexible approach that allows intuitive scripting by verification engineers. As shown in FIG. 9, DramCfg is the definition to specify the expected combinations. ClkMode covers four different combinations, as shown in Table 3 below.

TABLE 3

| Kind | BaseClock |
|------|-----------|
| MDDR | 333 |
| MDDR | 400 |
| DDR | 333 |
| DDR | 400 |

In some embodiments, the systems and methods may define the two statements of DramCfg and ClkMode to identify (or define) the two expected combinations when referring to the same parameter "Kind". In this situation, the user does not need to consider both statements at the same time. Instead, the user can define them one-by-one without considering the other statement. This approach helps to simplify the complex conditions of verification.

Figure 10:
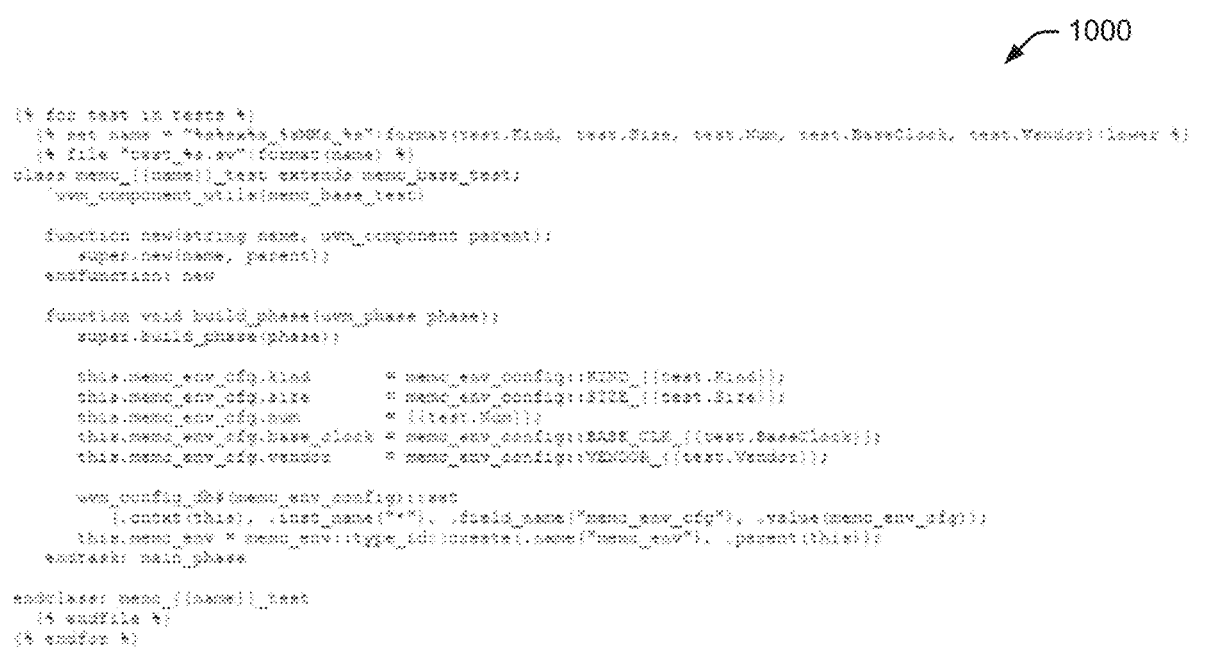

In addition to generating the test suites, the iTGV can also generate test codes that can be executed directly in other testing and simulation environments, such as System Verilog, C, and the like. This feature is available using the iTGV templates, another text file input that can be separately defined by users. FIG. 10 illustrates an example of an iTGV template 1000.

In some embodiments, a user will make iTGV templates based on their requirements. The template is closed by "{% for test in tests %}" and "{% endfor %}". This means that the template is rendered for each test with the different parameters based on the generated test suite. The string "{{test.*}}" are replaced with the value of each test. For example, the line in FIG. 10: this.memc_env_cfg.kind=memc_env_config:: KIND_{{test.Kind}};

In the example of Table 2 above, the code will be replaced with:

1 to #3 and #6 test:
this.memc_env_cfg.kind=memc_env_config::
KIND_DDR
4 and #5 test:
this.memc_env_cfg.kind=memc_env_config::
KIND_MDDR;

FIG. 11 illustrates an example list of iTGV syntax statements 1100. The iTGV syntax is designed to be simple in that it requires a user to know only two statements and eight operators. They are used to define two given objects in three categories for either "expected" or "prohibited" combinations, as shown in FIG. 11.

As discussed herein, the Constrained Random approach is automatic but wasteful. The Directed approach hits the target precisely but typically requires a significant amount of manual work. The iTGV discussed herein provides an improved system and method. Using the iTGV, verification engineers can replace the Directed approach with the iTGV. In some situations, the verification engineers can use the iTGV as their main test-generation tool and then use the Constrained Random approach as a complement to provide additional coverage in unexpected and unintended areas. This is particularly useful in cases where a verification engineer knows that they must insert some specific test sequence to reach a particular deep state.

Figure 12:
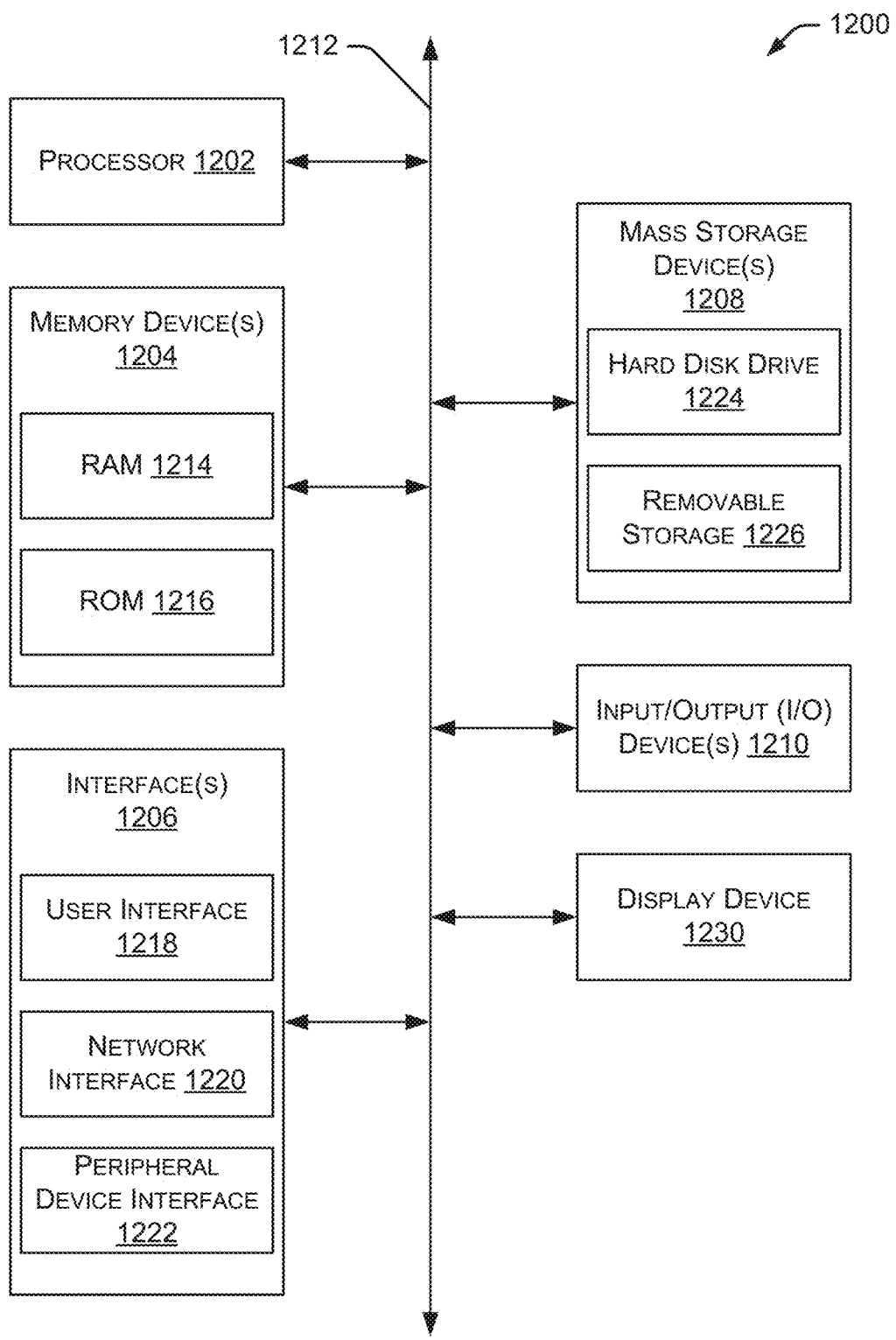
FIG. 12 illustrates an example block diagram of a computing device.

FIG. 12 illustrates an example block diagram of a computing device 1200. Computing device 1200 may be used to perform various procedures, such as those discussed herein. For example, computing device 1200 may perform any of the functions or methods of the computing devices and systems discussed herein. Computing device 1200 can perform various functions as discussed herein, and can execute one or more application programs, such as the application programs or functionality described herein. Computing device 1200 can be any of a wide variety of computing devices, such as a desktop computer, a notebook computer, a server computer, a handheld computer, tablet computer, a wearable device, and the like.

Computing device 1300 includes one or more processor(s) 1202, one or more memory device(s) 1204, one or more interface(s) 1206, one or more mass storage device(s) 1208, one or more Input/Output (I/O) device(s) 1210, and a display device 1230 all of which are coupled to a bus 1212. Processor(s) 1202 include one or more processors or controllers that execute instructions stored in memory device(s) 1204 and/or mass storage device(s) 1208. Processor(s) 1202 may also include various types of computer-readable media, such as cache memory.

Memory device(s) 1204 include various computer-readable media, such as volatile memory (e.g., random access memory (RAM) 1214) and/or nonvolatile memory (e.g., read-only memory (ROM) 1216). Memory device(s) 1204 may also include rewritable ROM, such as Flash memory.

Mass storage device(s) 1208 include various computer readable media, such as magnetic tapes, magnetic disks, optical disks, solid-state memory (e.g., Flash memory), and so forth. As shown in FIG. 12, a particular mass storage device is a hard disk drive 1224. Various drives may also be included in mass storage device(s) 1208 to enable reading from and/or writing to the various computer readable media. Mass storage device(s) 1208 include removable media 1226 and/or non-removable media.

I/O device(s) 1210 include various devices that allow data and/or other information to be input to or retrieved from computing device 1200. Example I/O device(s) 1210 include cursor control devices, keyboards, keypads, microphones, monitors or other display devices, speakers, printers, network interface cards, modems, and the like.

Display device 1230 includes any type of device capable of displaying information to one or more users of computing device 1200. Examples of display device 1230 include a monitor, display terminal, video projection device, and the like.

Interface(s) 1206 include various interfaces that allow computing device 1200 to interact with other systems, devices, or computing environments. Example interface(s) 1206 may include any number of different network interfaces 1220, such as interfaces to local area networks (LANs), wide area networks (WANs), wireless networks, and the Internet. Other interface(s) include user interface 1218 and peripheral device interface 1222. The interface(s) 1206 may also include one or more user interface elements 1218. The interface(s) 1206 may also include one or more peripheral interfaces such as interfaces for printers, pointing devices (mice, track pad, or any suitable user interface now known to those of ordinary skill in the field, or later discovered), keyboards, and the like.

Bus 1212 allows processor(s) 1202, memory device(s) 1204, interface(s) 1206, mass storage device(s) 1208, and I/O device(s) 1210 to communicate with one another, as well as other devices or components coupled to bus 1212. Bus 1212 represents one or more of several types of bus structures, such as a system bus, PCI bus, IEEE bus, USB bus, and so forth.

For purposes of illustration, programs and other executable program components are shown herein as discrete blocks, although it is understood that such programs and components may reside at various times in different storage components of computing device 1200, and are executed by processor(s) 1202. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

While various embodiments of the present disclosure are described herein, it should be understood that they are presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the described exemplary embodiments, but should be defined only in accordance with the following claims and their equivalents. The description herein is presented for the purposes of illustration and description. It is not intended to be exhaustive or to limit the disclosure to the precise form disclosed. Many modifications and variations are possible in light of the disclosed teaching. Further, it should be noted that any or all of the alternate implementations discussed herein may be used in any combination desired to form additional hybrid implementations of the disclosure.

The invention claimed is:

1. A hardware test suite generator comprising:
a script reader configured to receive a test definition script and parse the test definition script, wherein the test definition script includes first sets of parameters of a design to be tested in combination and one or more second sets of parameters of the design that are forbidden to be tested in combination;
a test generator configured to receive the parsed test definition script from the script reader, the test generator further configured to create a test suite;
a template reader configured to receive a test definition template and parse the test definition template; and
a code generator configured to receive the parsed test definition script from the script reader and receive the parsed test definition template from the template reader and generate code by, for each first set of the first sets, inputting values for the parameters of the design of each first set into the test definition template.

2. The hardware test suite generator of claim 1, wherein the code generator is further configured to receive the test suite.

3. The hardware test suite generator of claim 1, wherein the code generator is further configured to generate a test code.

4. The hardware test suite generator of claim 3, wherein the test code is usable in other verification environments.

5. The hardware test suite generator of claim 3, wherein the test suite and the test code are communicated to a hardware platform for testing.

6. The hardware test suite generator of claim 5, wherein the hardware platform includes one of a field-programmable gate array (FPGA), a digital signal processor (DSP), and a microcontroller.

7. The hardware test suite generator of claim 1, wherein the test definition script can be modified to perform different testing activities.

8. The hardware test suite generator of claim 1, wherein the test definition script can identify multiple iterations to provide 100% testing coverage such that all combinations of the first sets of parameters are tested and combinations of the second sets of parameters are avoided.

9. The hardware test suite generator of claim 1, wherein the hardware test suite generator supports tracking during a verification process.

10. The hardware test suite generator of claim 1, wherein the hardware test suite generator supports an incremental verification process to generate additional test suites that cover additional defined parameter combinations, the additional test suites based only on changes to the test definition script.

11. The hardware test suite generator of claim 1, wherein the hardware test suite generator defines an n-D space by Base Axis of the test definition script.

12. The hardware test suite generator of claim 1, wherein creation of the test suite is based on set operations in n-D space.

13. A method comprising:
  receiving a test definition script and a test definition template from a user, wherein the test definition script includes first sets of parameters of a design defining base axes of a space for testing and second sets of parameters of the design that are forbidden to be tested in combination;
  reading, by a hardware test suite generator, the test definition script and the test definition template;
  parsing and composing, by the hardware test suite generator, the test definition script and the test definition template; and
  generating, by the hardware test suite generator, a test suite and a test code for each first set of the first sets by inputting values for the parameters of the design of each first set into the test definition template.

14. The method of claim 13, wherein the test code is usable in other verification environments using additional templates corresponding to the other verification environments.

15. The method of claim 13, wherein the test suite and the test code are communicated to a hardware platform for testing.

16. The method of claim 15, wherein the hardware platform includes one of a field-programmable gate array (FPGA), a digital signal processor (DSP), and a microcontroller.

17. The method of claim 13, wherein the test definition script can be modified to perform different testing activities.

18. The method of claim 13, wherein the test definition script can identify multiple iterations to provide 100% testing coverage such that all combinations of the first sets of parameters are tested and combinations of the second sets of parameters are avoided.

19. The method of claim 13, wherein the hardware test suite generator supports an incremental verification process to generate test suites that cover additional defined parameter combinations.

* * * * *